(12) United States Patent
Shiu et al.

(10) Patent No.: US 8,036,061 B2
(45) Date of Patent: Oct. 11, 2011

(54) INTEGRATED CIRCUIT WITH MULTIPORTED MEMORY SUPERCELL AND DATA PATH SWITCHING CIRCUITRY

(75) Inventors: Shinye Shiu, Mountain View, CA (US); Brian P. Lilly, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 355 days.

(21) Appl. No.: 12/371,363

(22) Filed: Feb. 13, 2009

(65) Prior Publication Data
US 2010/0208540 A1    Aug. 19, 2010

(51) Int. Cl.
G11C 8/00    (2006.01)
(52) U.S. Cl. .................. 365/230.03; 365/230.05; 711/5
(58) Field of Classification Search ............. 365/230.03, 365/230.05; 711/5
See application file for complete search history.

(56) References Cited

U.S. PATENT DOCUMENTS

| | | | |
|---|---|---|---|
| 6,789,155 B2 * | 9/2004 | Jeddeloh ........................... | 711/5 |
| 7,505,353 B2 * | 3/2009 | Kim et al. ................ | 365/230.05 |
| 7,526,612 B2 | 4/2009 | Nakazato | |
| 7,571,287 B2 | 8/2009 | Lee et al. | |
| 7,600,081 B2 | 10/2009 | Sutardja | |
| 7,817,470 B2 * | 10/2010 | Kim .......................... | 365/185.11 |
| 2003/0086315 A1 | 5/2003 | Mizuno et al. | |
| 2003/0101307 A1 | 5/2003 | Gemelli et al. | |
| 2005/0174825 A1 | 8/2005 | Ware et al. | |
| 2007/0091707 A1 | 4/2007 | Hidaka | |

OTHER PUBLICATIONS

Written Opinion from PCTU/US 10/24021 mailed May 28, 2010, 8 pages.

* cited by examiner

*Primary Examiner* — Tuan Nguyen
*Assistant Examiner* — Toan Le
(74) *Attorney, Agent, or Firm* — B. Noel Kivlin; Meyertons Hood Kivlin Kowert & Goetzel PC; Erika A. Heter

(57) ABSTRACT

An integrated circuit. The integrated circuit includes a plurality of memory requesters and a memory supercell. The memory supercell includes a plurality of memory banks each of which forms a respective range of separately addressable storage locations, wherein the memory supercell is organized into a plurality of bank groups. Each of the plurality of bank groups includes a subset of the plurality of memory banks and a corresponding dedicated access port. The integrated circuit further includes a switch coupled between the plurality of memory requesters and the memory supercell. The switch is configured, responsive to a memory request by a given one of the plurality of memory requesters, to connect a data path between the given memory requester and the dedicated access port of a particular one of the bank groups addressed by the memory request.

24 Claims, 7 Drawing Sheets

INTEGRATED CIRCUIT WITH MULTIPORTED MEMORY SUPERCELL AND DATA PATH SWITCHING CIRCUITRY

BACKGROUND OF THE INVENTION

1. Field of the Invention

This invention relates to integrated circuits, and more particularly, to the arrangement of memory and associated access paths within an integrated circuit.

2. Description of the Related Art

Computers and other types of electronic systems often include a memory hierarchy having several different layers. Among these layers may be included non-volatile storage (e.g., hard disk storage), random access memory (RAM), and one or more levels of cache memory. Processor-based systems may include a processor having one or more cores, wherein each of the one or more cores includes one or more cache memories. For example, many processors include at least one processor core having an instruction cache and a data cache, which may be at the top of the memory hierarchy. A cache memory at the top of the memory hierarchy may be referred to as a level one (or L1) cache. Many processors also include a level two (or L2) cache, which may be shared by the data and instruction caches of a processor core, and furthermore, may be shared by multiple processor cores in multi-core processors.

When provided on an integrated circuit (IC), some of these types of memories, such as L2 caches, may be organized into what are known as memory supercells. A memory supercell is a 2-dimensionally array of memory banks (e.g., rows and columns of memory banks) that shares a common interface (sometimes referred to as a 'tap point'). In particular, when designing an IC, each memory bank may be in the form of a cell whose location on the IC die and interconnects to other defined cells and/or other functional units may be manipulated by an IC design tool. A memory supercell is simply a collection of such memory bank cells interconnected to form a larger, unified memory cell that may similarly be located on the IC by the design tool.

In such a memory supercell, a given address maps to one bank of the supercell. Information transferred to a supercell during a write operation may be received by the interface and then routed to a location in a memory bank indicated by the address which maps thereto. Similarly, when performing a read operation, information may be routed from an addressed location in one of the memory banks of the supercell to the interface, and thus to the requesting device.

SUMMARY OF THE INVENTION

An integrated circuit is disclosed. In one embodiment, the integrated circuit includes a plurality of memory requesters and a memory supercell. The memory supercell includes a plurality of memory banks each of which forms a respective range of separately addressable storage locations, wherein the memory supercell is organized into a plurality of bank groups. Each of the plurality of bank groups includes a subset of the plurality of memory banks and a corresponding dedicated access port. The integrated circuit further includes a switch coupled between the plurality of memory requesters and the memory supercell. The switch is configured, responsive to a memory request by a given one of the plurality of memory requesters, to connect a data path between the given memory requester and the dedicated access port of a particular one of the bank groups addressed by the memory request.

BRIEF DESCRIPTION OF THE DRAWINGS

Other aspects of the invention will become apparent upon reading the following detailed description and upon reference to the accompanying drawings in which.

Figure 1:
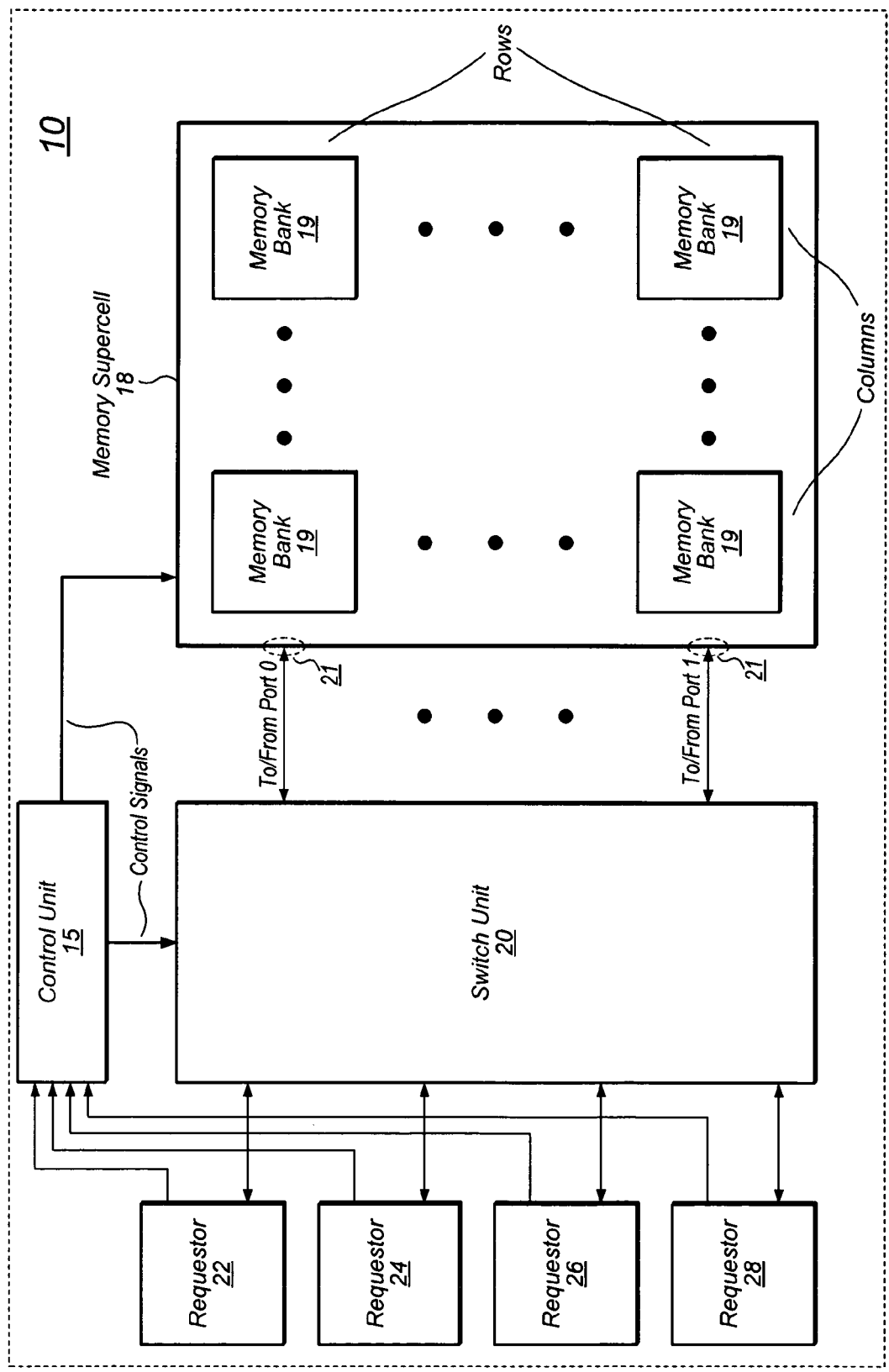
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Turning now to FIG. 1, a block diagram of one embodiment of an integrated circuit is shown. In the illustrated embodiment, integrated circuit (IC) 10 includes requesters 22, 24, 26, and 28, each of which is coupled to a control unit 15 and a switch unit 20. IC 10 also includes a memory supercell 18 coupled to switch unit 20. The various components of IC 10 shown in FIG. 1 may be implemented on a single IC die in some embodiments. In the embodiment shown, switch unit 20 is located physically between (and external to) memory supercell 18 and requesters 22-28.

Each of requesters 22-28 is representative of any subsystem or device that requires access to a memory external thereto, such as memory supercell 18. Such access may include read accesses, write accesses, or both. In some embodiments, each of requesters 22-28 may be identical functional units (e.g., cores of a symmetric multi-core processor including, for example, an instruction cache and a data cache, etc.). In other embodiments, at least one of requesters 22-28 may be different from the other requesters (e.g., cores in an asymmetric multi-core processor). The particular number of requesters may vary from one embodiment to the next, and may be greater or lesser than shown here. Embodiments with as few as one requestor are possible and contemplated.

In the embodiment shown, memory supercell 18 includes a plurality of memory banks 19. As discussed above, during a design phase of the IC, each of the memory banks may be defined as a cells that may be manipulated by a design tool. At its conception, memory supercell 18 may likewise by defined to allow its location and interconnections to other cells or functional units to be manipulated by the design tool.

Memory supercell 18 in the embodiment shown includes a two-dimensional array of memory banks 19. The arrangement is such that at least two of memory banks 19 are arranged in a first direction (e.g., rows) while at least two of memory banks 19 are arranged in a second direction (e.g., columns). The particular number of memory banks 19 in each direction of the two-dimensional may vary from one embodiment to the next. Each memory bank 19 may form a respective range of separately addressable storage locations. Memory access requests may each be addressed to one or more of these separately addressable storage locations.

Memory supercell 18 in FIG. 1 is coupled to switch unit 20 through ports 21 (sometimes referred to as 'tap points'), denoted as Port 0 and Port 1 in this embodiment. As will be discussed below, the plurality of memory banks 19 shown in FIG. 1 may be organized into separate bank groups. Transfer of data (the term "data" as used herein is intended to include instructions) to or from banks of a given bank group may occur exclusively through a port 21 that is associated with that particular bank group, while transfer of data to/from another bank group occurs through another port, as will also be discussed in further detail below.

Each of requesters 22-28 in the embodiment shown is configured to provide signals to control unit 15 indicating a request for access to memory supercell 18. When providing a request for access to memory supercell 18, a particular requester 22-28 may provide information to control unit 15 indicating the address to be accessed, as well as indicating whether the request is a read request or a write request. Control unit 15 is configured to responsively determine a path for conveying data between the memory location identified by the request and the corresponding requestor. In particular, control unit 15 may be configured to determine the various segments in switch unit 20 to form the path between the port of memory supercell 18 associated with the requested memory location and the corresponding requestor. Responsive to receiving control signals from control unit 15, switch unit 20 is configured to select segments that form the path between the requester and the port of memory supercell 18 associated with the request.

Control unit 15 may also provide certain control signals directly to the bank group that includes the requested memory location. Such control signals may include enable signals (e.g., read enable, write enable) and selection signals (e.g., for selecting the bank and address associated with the request). In situations where multiple outstanding access requests are received, control unit 15 may perform prioritization functions in order to determine an order for carrying out the requests.

Figure 2:
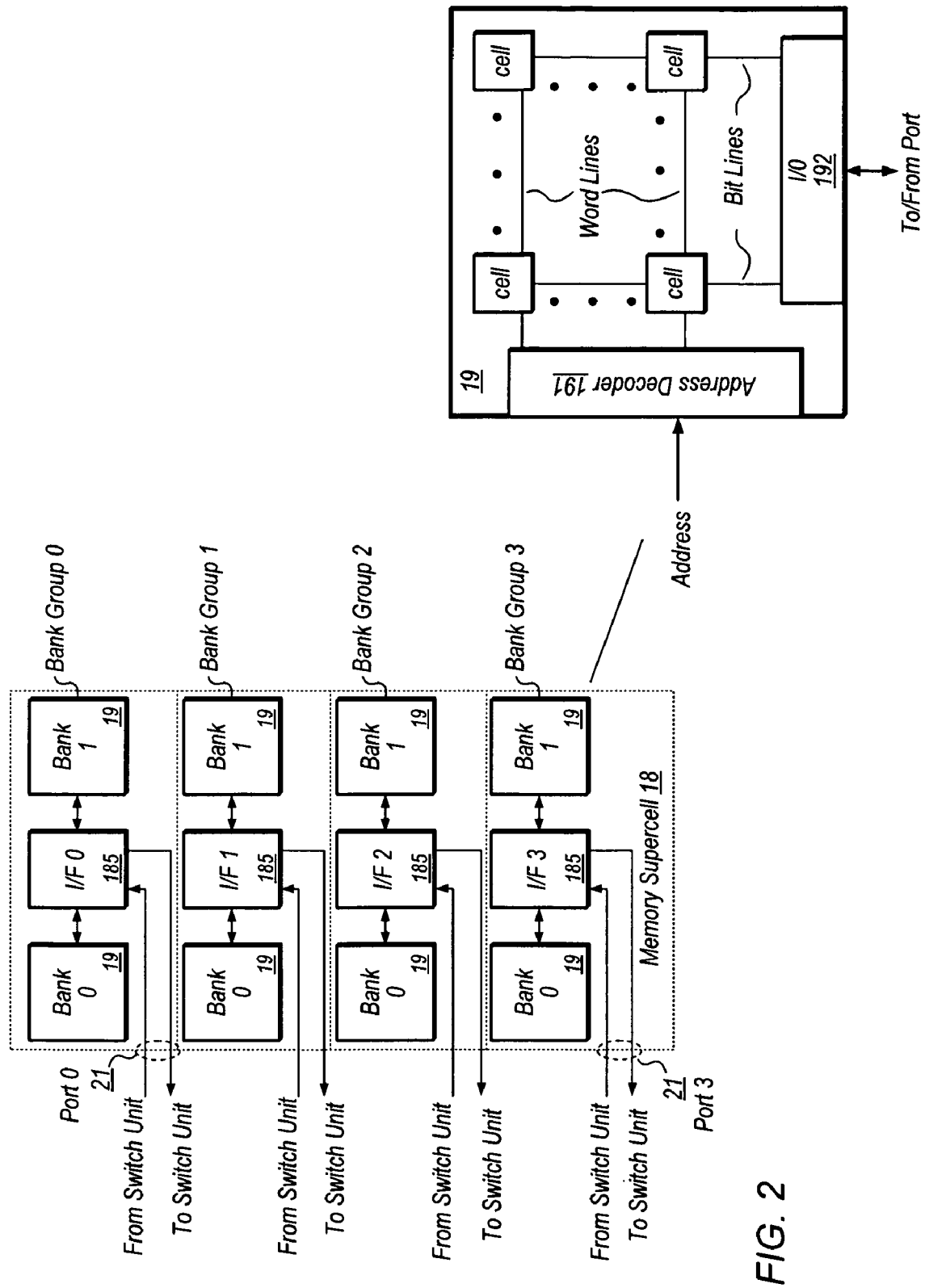
FIG. 2 is a block diagram of one embodiment of a memory supercell.

Turning now to FIG. 2, a block diagram of one embodiment of memory supercell 18 is shown. FIG. 2 also illustrates a representative one of a plurality of memory banks 19. In the embodiment shown, memory supercell 18 includes eight memory banks 19 that are organized into four rows and two columns. Memory supercell 18 is further organized into four memory units, referred to here as Bank Group 0, Bank Group 1, Bank Group 2, and Bank Group 3. Each of these bank groups includes a corresponding port 21 coupled to a corresponding I/F unit 185, e.g., Bank Group 0 includes Port 0, which is coupled to I/F 0, and so forth. Each port 21 of a given memory group is exclusive to the memory banks 19 of that group. Similarly, each I/F unit 185 of a given memory group is exclusive to the memory banks 19 of that group. For example, data transfer to or from any of the memory banks of Bank Group 0 occurs through port 0 and I/F 0, while data transfer to or from any of the memory banks of Bank Group 3 occurs through port 3 and I/F 3. Each of the I/F units 185 provides an interface for conveying data between the memory banks of that particular bank group and the corresponding port 21 of that particular memory group. Each I/F unit 185 may include switching circuitry (e.g., multiplexers, demultiplexers, etc.) configured to route data between a given memory bank 19 and the corresponding port 21 during an access to a location in that bank. In some embodiments, each I/F unit 185 may also provide address information and/or other control signals to the memory banks 19 of its particular bank group. However, embodiments wherein address information and control signals are provided by other functional units (e.g., directly from control unit 15 of FIG. 1) are also possible and contemplated.

In the embodiment shown, each of the memory banks 19 of a given bank group is in closer physical proximity to its associated port 21 than to those ports 21 associated with other bank groups. For example, the memory banks 19 of Bank Group 0 are in closer physical proximity to Port 0 than to those ports associated with any of Bank Groups 1-3. In contrast to embodiments wherein a single port might otherwise be provided for a memory supercell (and thus a single port interface unit), the arrangement shown in FIG. 2 may minimize the distance that data is driven to/from a given memory bank 19 within memory supercell 18 from/to an external location. It is also noted that the circuitry forming each I/F unit 185 may be physically provided in a central location between the memory banks 19 of a given bank group.

When implemented in an integrated circuit such as IC 10, each port 21 of memory supercell 18 may be coupled to receive data from the switch unit 20 through a first path and coupled to provide data to the switch unit through a second path (i.e. in embodiments in which unidirectional paths are used for writing data and reading data). Accordingly, as will be discussed in further detail below, this arrangement may allow for concurrent read and write operations, wherein information is written to a memory location in a first bank group and read from a memory location in a second bank group.

As noted above, FIG. 2 also illustrates one embodiment of a representative memory bank 19. Other types of memory banks are also possible and contemplated for implementation within memory supercell 18. In the embodiment shown, memory bank 19 includes a plurality of memory bit cells arranged in an array of rows and columns. Memory bit cells in a given row are coupled to each other by word lines, while memory bit cells in a given column are coupled to each other by bit lines. In the embodiment shown, each memory bit cell is coupled to a single bit line, although embodiments wherein memory bit cells coupled to two bit lines (e.g. to convey true and complementary data) are possible and contemplated.

Memory bank 19 in the embodiment shown includes an address decoder 191 and an I/O unit 192. Address decoder 191 is coupled to receive an address from an external source (e.g., from an I/F unit 185 or from a control unit 15 of the embodiments discussed above) and is configured to decode the received address. I/O unit 192 may include various circuitry for reading information from the memory cells and/or writing information to the memory cells. For example, in one embodiment, I/O unit 192 includes a plurality of sense amplifiers, each of which is coupled to a corresponding bit line. I/O unit 192 may also include a plurality of driver circuits, each of which is coupled to a corresponding bit line.

In the embodiment shown, address decoder 191 is configured to decode the address in order to activate a word line corresponding thereto. When activated, a given word line may cause the memory cells coupled thereto to be transparent to their respective bit lines (i.e. the memory cells of the decoded address are selected). During read operations, the data stored in the selected memory cells may be sensed by the sense amplifiers of I/O unit 192 and driven from memory bank 19 to the corresponding I/F unit 185 (and thus to the corresponding port 21 as well). During write operations, data may be received by driver circuits in I/O unit 192 and thus written into the selected memory cells. When the read or write operation is complete, the word line of the selected memory cells is deactivated, and thus that data most recently written into the memory cells is stored.

Figure 3:
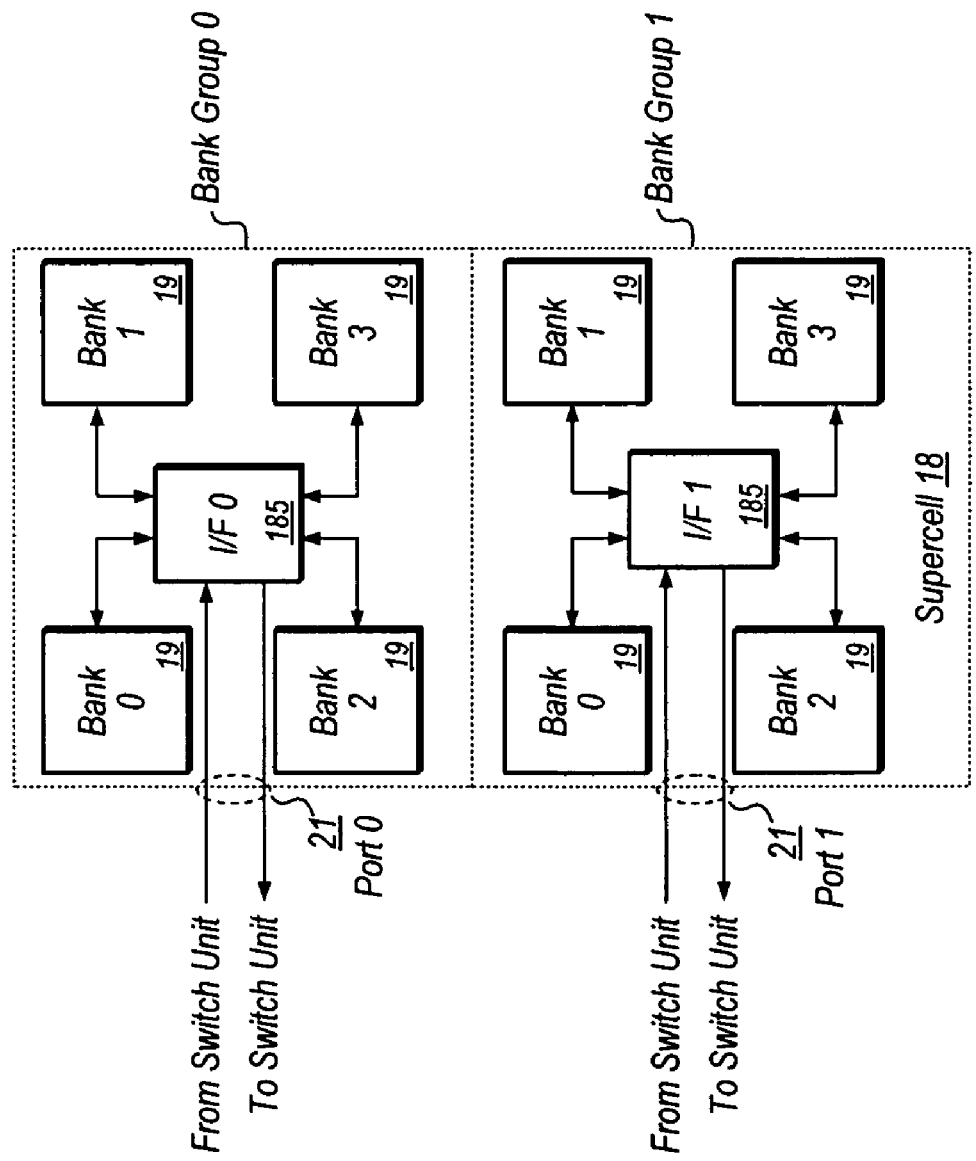
FIG. 3 is a block diagram of another embodiment of a memory supercell.

FIG. 3 is a block diagram of another embodiment of a memory supercell 18. In this particular embodiment, memory supercell 18 includes two bank groups instead of the four shown in the embodiment of FIG. 2. Accordingly, memory supercell 18 of FIG. 3 includes two ports 21 and two I/F units 185. Each of the bank groups in this particular embodiment includes four memory banks 19.

Generally speaking, memory supercells 18 may be implemented in a wide variety of configurations in accordance with this disclosure. Each memory supercell may include a plurality of bank groups, each of which includes a plurality of memory banks. Each bank group may include a port and an I/F unit that are each exclusive to that particular bank group (i.e., a given port is dedicated to conveying data being written to or read from a location within the corresponding bank group (i.e., and does not convey data to/from other bank groups)). Moreover, the memory banks of a particular bank group may be in closer physical proximity to the port associated with that bank group than to the ports associated with the other bank groups. This may reduce the distance in which data is driven between a particular memory bank in a bank group and the port of that bank group and thus the overall distance to a given memory requester. Reducing the overall amount of distance that data is driven may result in relatively lower power consumption, and may also reduce latency associated with data transfers.

Figure 4:
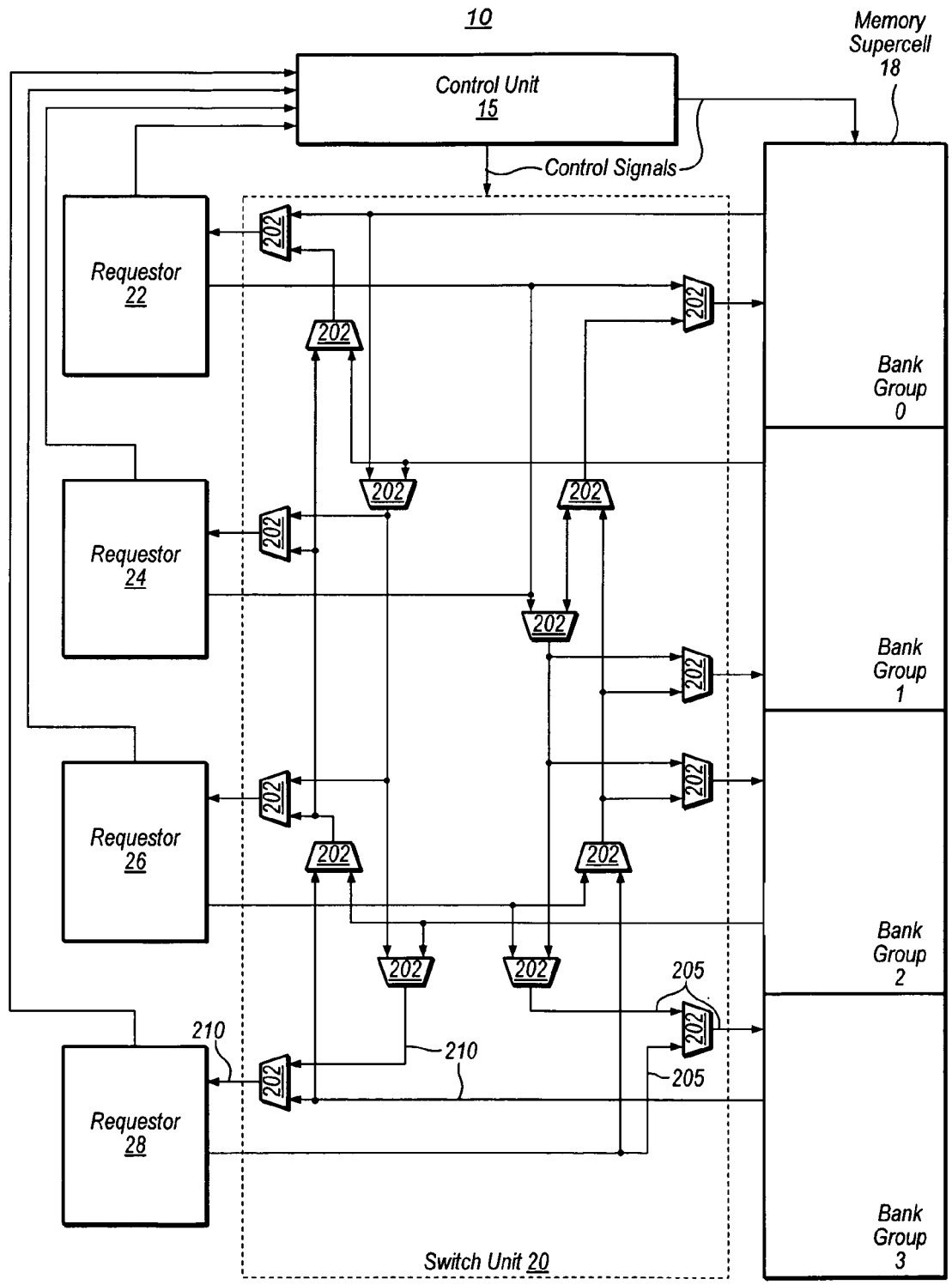
FIG. 4 is a block diagram of an integrated circuit, the block diagram illustrating one embodiment of a switching unit in more detail.

FIG. 4 is a diagram of IC 10 that illustrates one embodiment of switch unit 20 in further detail. Elements of FIG. 4 that correspond to those of the drawings discussed above are numbered identically for the sake of simplicity. It is noted that memory supercell 18 as shown in FIG. 4 may be embodied according to the configuration of FIG. 2 or the configuration of FIG. 3, among others.

In the embodiment shown, switch unit 20 includes a plurality of selection circuits 202, and further includes a plurality of segments 205 and 210. For the sake of simplicity, only representative ones of the segments are labeled. Segments 205 form a first subset of the plurality of segments, and are usable to convey information (write data) from the requesters 22-28 to a selected bank group of memory supercell 18. Segments 210 form a second subset of the plurality of segments, and are usable to convey information (read data) from a selected bank group of memory supercell 18 to one of requesters 22-28. Thus, segments 205 are unidirectional in a first direction, while segments 210 are unidirectional in a second direction. Each segment may comprise a plurality of signal lines (e.g., conductors) upon which bits of information are conveyed to transfer data between memory supercell 18 and one of requesters 22-28.

Each selection circuit 202 in this embodiment is configured to electrically couple particular ones of the plurality of segments to at least one other one of the plurality of segments. In the embodiment shown, each selection circuit 202 is configured to perform a multiplexing function. More particularly, each of selection circuits 202 in this embodiment is configured to select one of two segments to be electrically coupled to another segment. In general, various embodiments of switch unit 20 may be implemented using selection circuits 202 that perform a multiplexing function, a de-multiplexing function, a gating function, or various combinations thereof. Selection circuits 202 that perform a multiplexing function may couple two or more input segments to a third (output) segment. Selection circuits 202 that perform a de-multiplexing function may couple an input segment to one of two or more output segments. Selection circuits 202 that perform a gating function may, when enabled, couple an input segment to an output segment.

Although not explicitly shown here, each selection circuit 202 in the embodiment shown is coupled to receive one or more control signals from control unit 15. More particularly, each selection circuit 202 in this embodiment is coupled to receive at least a selection signal indicating which of the two corresponding input segments is to be electrically coupled to the corresponding output segment. In some embodiments, each selection circuit 202 may also be coupled to receive an enable signal. An enable signal may be asserted to enable the selection circuit 202 when it is to be used to form a path between one of requesters 22-28 and one of bank groups 0-3 of memory supercell 18. An enable signal provided to a selection circuit 202 may be de-asserted when that selection circuit is not in use. When disabled, a selection circuit 202 may cause signal lines of an output segment to be put in a high impedance state.

Since the embodiment shown divides the plurality of segments into separate first and second subsets (i.e. into a first subset comprising segments 205 and a second subset comprising segments 210), concurrent reads and writes may be supported. For example, data may be written from requester 22 to a location in bank group 0 while data is concurrently read by requester 28 from bank group 3. Concurrent reads and writes involving a single bank group and/or a single requester may also be supported in some embodiments. For example, requester 24 may write data to a location in bank group 1 while concurrently reading data from a location in bank group 2 in such an embodiment. In another example, one such embodiment may support requester 26 writing data into a first location of bank group 2 while requester 24 concurrently reads data from a second location in bank group 2. As noted above, control unit 15 may be configured to perform prioritization functions, and may thus schedule concurrent read and write accesses in embodiments where these concurrent accesses are supported. Control unit 15 may also be configured to prevent concurrent reads and writes in certain situations (e.g., if there is a request to read from and a write to the same memory location).

Figure 5:
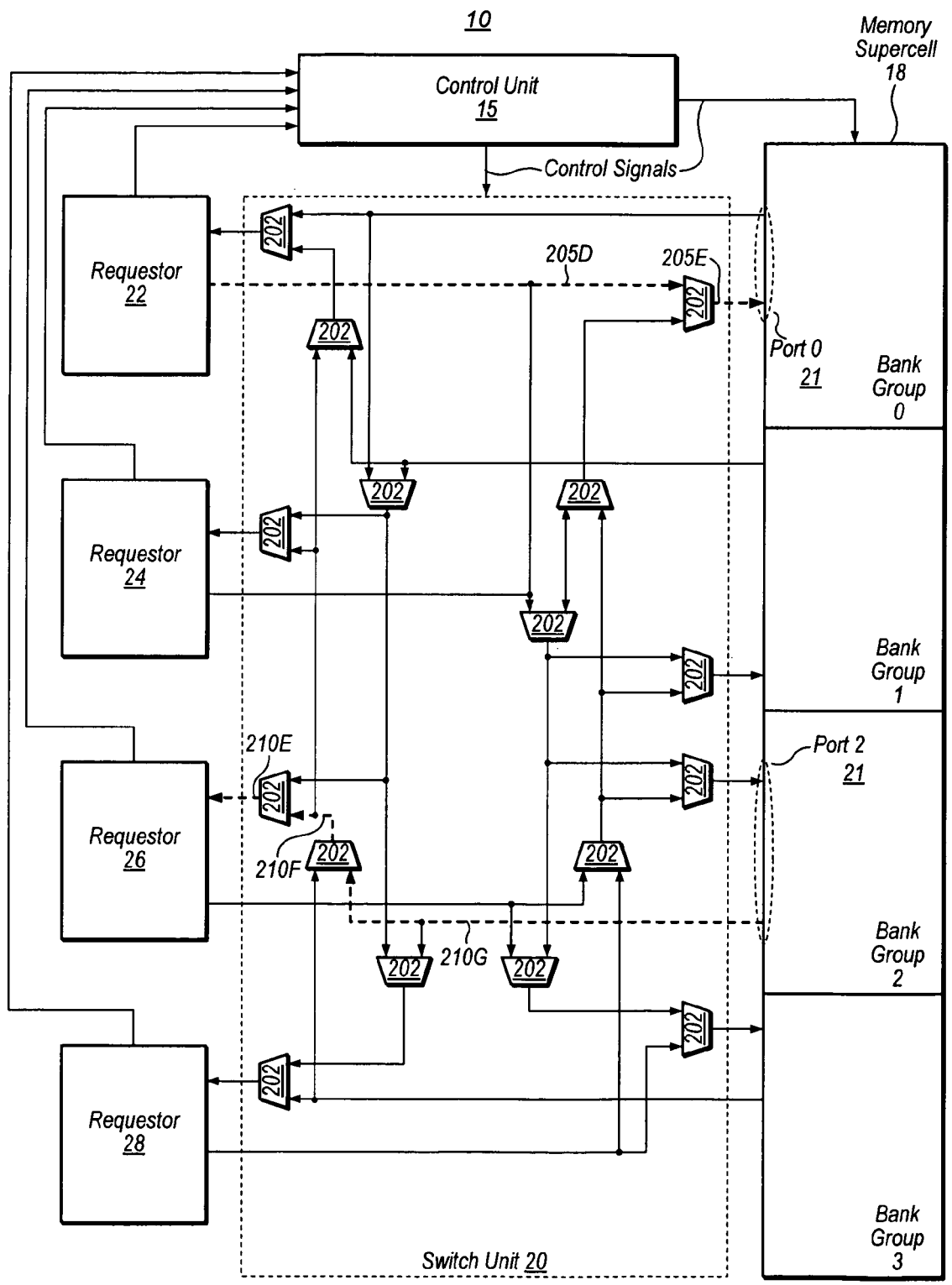
FIG. 5 is a block diagram illustrating further details of one embodiment of an integrated circuit.

FIG. 5 is a block diagram illustrating examples of the selection of paths between a requester and a bank group of a memory. The example shown here is based on the embodiment FIG. 4, and thus elements shown in FIG. 5 are numbered the same as their corresponding elements in FIG. 4. The paths shown in this example includes segments that are indicated by dashed lines and corresponding reference characters. Other segments shown as solid lines with no corresponding reference characters are not part of the indicated paths of this example.

In the example shown in FIG. 5, requester 22 is coupled to Bank Group 0 via a first path formed of segments 205D and 205E. Accordingly, requester 22 is coupled to write information to a memory location within Bank Group 0. In this same example, requester 26 is coupled to Bank Group 2 by a second path formed of segments 210E, 210F, and 210G. Accordingly, requester 26 in this example is coupled to read data from Bank Group 2. These paths may be configured as shown to enable requester 22 to write data to a location in bank group 0 while requester 26 concurrently reads data from a location in bank group 2. The ability to read data from a first location of memory supercell 18 while concurrently writing data to another location thereof may enable efficient overall operation. However, the paths shown in this example may be configured to enable the aforementioned read and write operations at different, non-concurrent times.

The example shown in FIG. 5 is such that, when driving data from requester 22 to Port 0 of Bank Group 0, data is driven only on those segments 205 which electrically connect requester 22 to Port 0. Similarly, the example shown is such that when driving data from Bank Group 2 to requester 26, data is driven only on those segments 210 which electrically connect Port 2 to requester 26. In general, when a given requester is to write data to a location in memory supercell 18 in the embodiment shown, data is driven only on those segments 205 electrically connected between the initiating requester and the port corresponding to the storage location to which the data is to be written. Similarly, when a given requester is to read data from a location in memory supercell 18 in the embodiment shown, data is driven only on those segments 210 electrically connected between the port associated storage location from which data is to be read and the input of the initiating requester. As a result, a relatively short data path may be provided, thus resulting in a lower distance over which signals corresponding to data are driven. This in turn may result in relatively low power consumption.

In general, switching circuit 20 is configured to cause particular ones of selection circuits 202 to select various ones of segments 205 to enable write operations from any one of requesters 22-28 to any of Bank Groups 0-3. Similarly, switching circuit 20 is configured to cause particular ones of selection circuits 202 to select various ones of segments 210 to enable read operations from any of Bank Groups 0-3 by any one of requesters 22-28. The selection of particular segments may be performed under the direction of control unit 15 in accordance with the type of request (read or write) and the requested location. When no conflicts are present (e.g., no attempt to concurrently read from and write to the same address), concurrent read and write operations may be performed.

Figure 6:
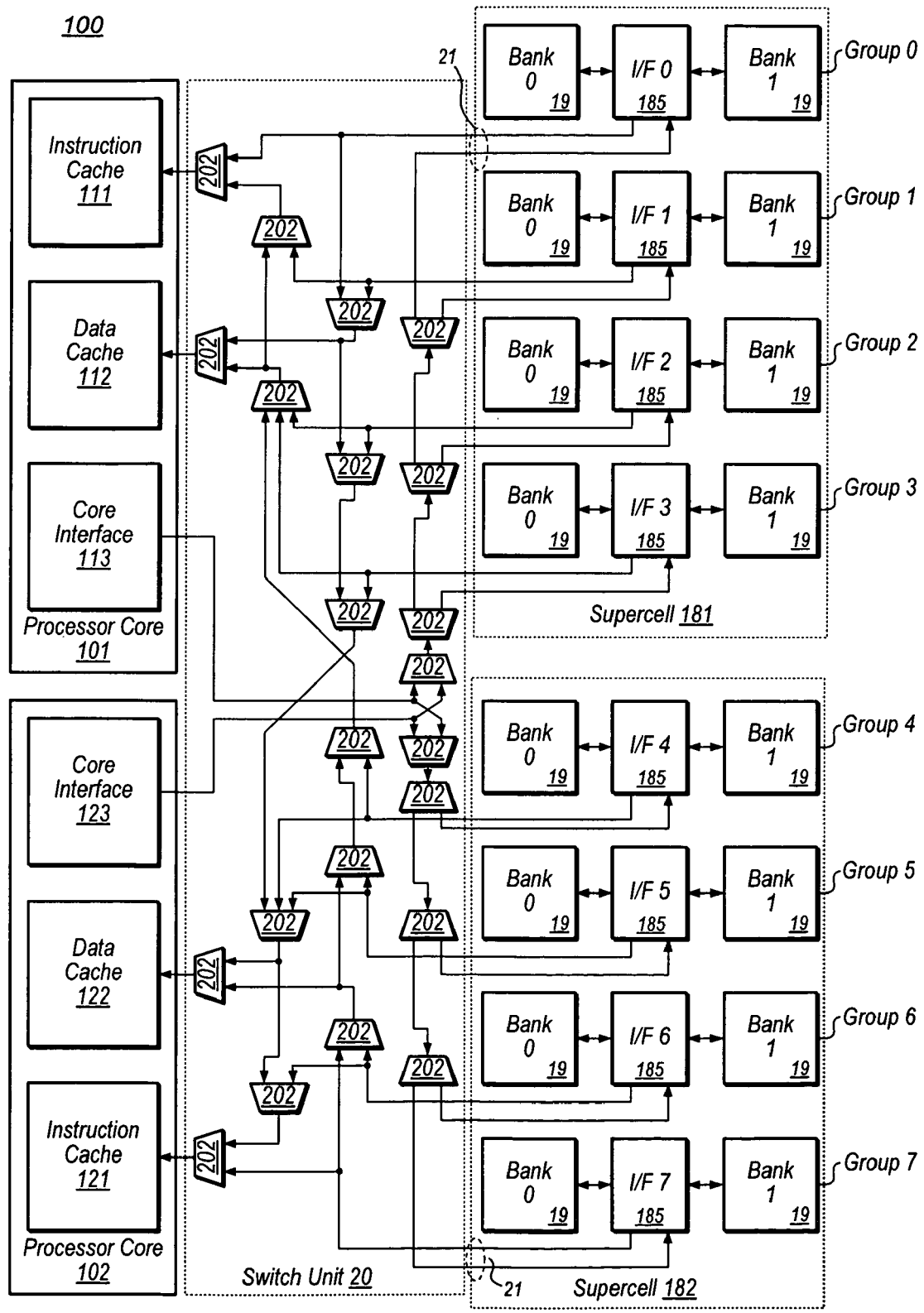
FIG. 6 is a block diagram illustrating one embodiment of an integrated circuit including multiple processor cores and a pair of memory supercells.

Turning now to FIG. 6, a block diagram of one embodiment of a processor system implemented on an integrated circuit having multiple processor cores and memory supercells is shown. In the embodiment shown, processor 100 includes a first processor core 101 and a second processor core 102. Each of processor cores 101 and 102 are coupled to a switch unit 20. Switch unit 20 is in turn coupled to an L2 cache 180 formed collectively by memory supercells 181 and 182. The circuitry forming switch unit 20 may be physically located between L2 cache 180 and the pair of processor cores shown in the drawing. Processor 100 may also include a control unit similar to control unit 15 of the embodiments described above, although it is not shown here for the sake of simplicity.

Processor core 101 includes an instruction cache 111, a data cache 112, and a core interface 113. Similarly, processor core 102 includes an instruction cache 121, a data cache 122, and a core interface 123. The instruction and data caches of processor cores 101 and 102 form level 1 (L1) caches in this embodiment. In this embodiment core interfaces 113 and 123 are cache writeback units configured to write information from the respective L1 caches to L2 cache 180. Core interfaces 113 and 123 may also include additional interface functionality that enables communications between their respective processor cores and other functional units.

In this particular embodiment, processor cores 101 and 102 perform the role of the requesters as discussed above. In their roles as requesters, processor cores 101 and 102 may receive data from memory supercells 181 and 182 via inputs to their respective instruction or data caches. Information may be output from processor cores 101 and 102 in this embodiment through their respective core interfaces. However, it should be noted that embodiments are possible and contemplated wherein each instruction cache, data cache, and core interface shown in the drawing are themselves able to perform the role of requesters. As such, when these units perform the role as requesters, they may initiate access requests that result in transfer of data to L2 cache 180 and/or the receipt of data from L2 cache 180.

As stated above, the embodiment shown in FIG. 6, L2 cache 180 includes a first memory supercell 181 and a second memory supercell 182. Each of memory supercells 181 and 182 shown in FIG. 6 is configured similarly to the embodiment of memory supercell 18 shown in FIG. 2. That is, each of memory supercells 181 and 182 includes four bank groups of two memory banks each, with each bank group including its own memory port 21 and its own I/F unit 185.

A cache line in the embodiment shown may be stored across both memory supercells 181 and 182 in this embodiment (e.g., for a 64 byte cache line, 32 bytes of a given cache line may be stored within a corresponding memory bank of memory supercell 181, and the 32 remaining bytes may be stored within a corresponding memory bank of memory supercell 182). Accordingly, processor system 100 may support a write to a memory location of a bank group in memory supercell 181 concurrently with a write to a memory location of a bank group in memory supercell 182. Similarly, processor 100 may also perform a read from a memory location in a bank group of memory supercell 181 concurrently with a read from a memory location in a bank group of memory supercell 182. In various embodiments, processor system 100 may allow concurrent reads and writes of different cache lines. Thus, this embodiment of processor 100 may support two read operations (one from memory supercell 181 and one from memory supercell 182 for a first cache line) that are performed concurrently with two write operations (one to memory supercell 181 and one to memory supercell 182 for a second cache line).

Figure 7:
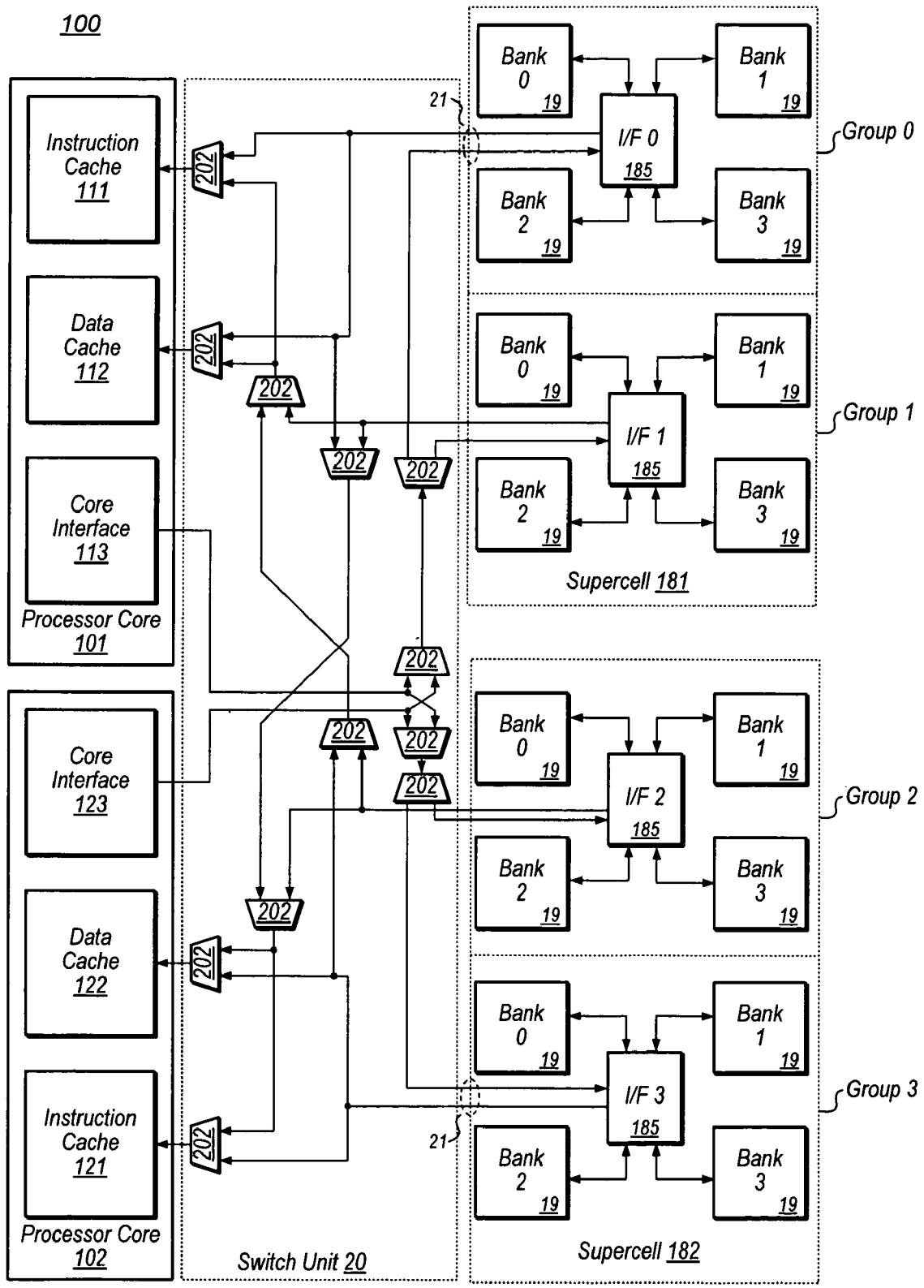
FIG. 7 is a block diagram illustrating another embodiment of an integrated circuit including multiple processor cores and a pair of memory supercells.

FIG. 7 is a block diagram illustrating another embodiment of a processor system. In this particular embodiment, memory supercells 181 and 182 of L2 cache 180 are each embodied according to the configuration of FIG. 3 discussed above. Each bank group includes a corresponding port 21 and a corresponding I/F unit 185. As with the embodiment discussed above, transfers of a cache line may include concurrently reading from both memory supercells 181 and 182, or writing to memory supercells 181 and 182.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
   a plurality of memory requestors;
   a memory supercell including a plurality of memory banks each of which forms a respective range of separately addressable storage locations, wherein the memory supercell is organized into a plurality of bank groups, wherein each of the plurality of bank groups includes a subset of the plurality of memory banks and a corresponding dedicated access port;

a switch coupled between the plurality of memory requestors and the memory supercell, wherein the switch is configured, responsive to a memory request by a given one of the plurality of memory requestors, to connect a data path between the given memory requestor and the dedicated access port of a particular one of the bank groups addressed by the memory request;

wherein, during a write request initiated by a particular requestor to write data to a storage location of the first bank group, data from the particular requestor is driven on a path to the first access port without driving data on segments connected to the second access port.

2. The integrated circuit as recited in claim 1, wherein each memory bank of the plurality of memory banks includes an address decoder.

3. The integrated circuit as recited in claim 1, wherein the switch includes a plurality of segments and a plurality of selection circuits, wherein each of the plurality of selection circuits is configured to electrically connect particular ones of the plurality of segments to another one of the plurality of segments to form a path between a particular requestor and either the first or second access port, wherein a first subset of the plurality of segments is configured to convey data to the memory supercell, and wherein a second subset of the plurality of segments is configured to convey data from the memory supercell.

4. The integrated circuit as recited in claim 1, wherein, during a read request initiated by a particular requestor to read data from the storage location of the first bank group, data is driven on a path from the first access port to the particular requestor without driving data on segments connected to other ones of the plurality of requestors.

5. An integrated circuit comprising:
a plurality of memory requestors;
a memory supercell including a plurality of memory banks, wherein each of the memory banks forms a respective range of separately addressable storage locations of the memory supercell, and wherein the memory supercell is configured such that data corresponding to requests addressed to storage locations of a first subset of the plurality of memory banks is provided exclusively through a first access port and such that data corresponding to requests addressed to storage locations of a second subset of the plurality of memory banks is provided exclusively through a second access port;
switching circuitry coupled between the plurality of memory requestors and the memory supercell, wherein the switching circuitry is configured, in response to a memory request by a given memory requestor of the plurality of memory requestors, to connect a first corresponding data path between the given memory requestor and the first access port if the memory request is addressed to a storage location of the first subset of the plurality of memory banks and to connect a second data path between the given memory requestor and the second access port if the memory request is addressed to a storage location of the second subset of the plurality of memory banks.

6. The integrated circuit as recited in claim 5, wherein the plurality of memory banks is organized in a two-dimensional array within the memory supercell, wherein the two-dimensional array includes at least two memory banks arranged in a first direction and at least two memory banks arranged in a second direction.

7. The integrated circuit as recited in claim 5, wherein the first subset of the plurality of memory banks is formed by a first pair of adjacent memory banks in a first row of the two dimensional array, and wherein the second subset of the plurality of memory banks of formed by a second pair of adjacent memory banks in a second row of the two dimensional array.

8. The integrated circuit as recited in claim 7, wherein the memory supercell includes a plurality of additional pairs of adjacent memory banks, wherein the memory supercell is configured such that data corresponding to requests addressed to storage locations of each additional pair of adjacent memory banks is provided exclusively through an additional corresponding access port.

9. The integrated circuit as recited in claim 5, wherein the first subset of the plurality of memory banks is in closer physical proximity to the first access port than to the second access port, and wherein the second subset of the plurality of memory banks is closer to the second access port than to the first access port.

10. An integrated circuit comprising:
one or more requestors;
a switching unit coupled to each of the one or more requestors, wherein the switching unit includes a plurality of segments and a plurality of selection circuits each configured to couple particular ones of the plurality of segments to another one of the plurality of segments;
a memory supercell including a plurality of memory banks organized in a two-dimensional array within the memory supercell, wherein the plurality of memory banks is divided into a plurality of bank groups each including a corresponding subset of the plurality of memory banks, wherein each of the bank groups is coupled to the switching unit independently of other ones of the plurality of bank groups within the memory supercell; and
a controller coupled to the switching unit and each of the one or more requestors, wherein responsive to a memory supercell access request from one of the requestors, the controller is configured to cause the switching unit to configure the selection circuits to select segments corresponding to a path between the one of the requestors and a bank group corresponding to a storage location associated with the request.

11. The integrated circuit as recited in claim 10, wherein each of the requestors is a processor core including a data cache and an instruction cache, wherein the data cache and the instruction cache of each processor core is coupled to the switching unit.

12. The integrated circuit as recited in claim 11, wherein the memory supercell forms at least part of a level two (L2) cache.

13. The integrated circuit as recited in claim 11, wherein a first subset of the plurality of segments is configured to convey data to the memory supercell, and wherein a different subset of the plurality of segments is configured to convey data from the memory supercell.

14. The integrated circuit as recited in claim 10, wherein each memory bank includes a plurality of cells arranged in a plurality of rows and a plurality of columns.

15. An integrated circuit comprising:
a plurality of processor cores;
a switching unit coupled to each of the plurality of processor cores, wherein the switching unit includes a plurality of segments and a plurality of selection circuits each configured to couple particular ones of the plurality of segments to another one of the plurality of segments;
a cache memory supercell including a plurality of memory banks, wherein each of the memory banks forms a respective range of separately addressable storage locations, wherein the plurality of memory banks is divided into a plurality of bank groups, wherein each of the plurality of bank groups includes:
- a subset of the plurality of memory banks, wherein each memory bank of a given subset is exclusive to that subset; and
- a memory port, wherein the memory port of a given bank group is dedicated to conveying data to and from memory banks of the given bank group; and a switch control unit coupled to the switching unit and each of the plurality of processors, wherein responsive to a cache access request from one of the processor cores, the switch control unit is configured to cause the switching unit to configure the selection circuits to select segments corresponding to a path between the one of the processor cores and a one of the plurality of bank groups corresponding to a storage location associated with the request.

16. The integrated circuit as recited in claim 15, wherein each of the plurality of processor cores includes a core interface unit coupled to the switching unit, wherein each of the plurality of processor cores is configured to convey a cache access request from its respective core interface unit.

17. The integrated circuit as recited in claim 15, wherein each of the plurality of processor cores includes a data cache coupled to receive data from the switching unit.

18. The integrated circuit as recited in claim 15, wherein each of the plurality of processor cores includes an instruction cache coupled to receive instructions from the switching unit.

19. The integrated circuit as recited in claim 15, wherein a first subset of the plurality of segments is configured to convey data to the cache memory, and wherein a different subset of the plurality of segments is configured to convey data from the cache memory.

20. An integrated circuit comprising:
one or more functional units;
a switch coupled to each of the one or more functional units, wherein the switch includes a plurality of segments and a plurality of selection circuits each configured to couple particular ones of the plurality of segments to another one of the plurality of segments;
a memory supercell organized into a plurality of bank groups, wherein each of the bank groups includes a plurality of memory banks, wherein each of the bank groups includes a memory port dedicated to provide data to or from the plurality of memory banks of the respective bank group and the switch; and
a control unit coupled to the switch and each of the one or more functional units, wherein responsive to a request for access to the memory supercell by a given one of the one or more functional units, the control unit is configured to cause the switch to select a plurality of segments forming a path between the given one of the functional units and a memory port corresponding to a storage location in a bank group associated with the request for access.

21. The integrated circuit as recited in claim 20, wherein a first subset of the plurality of segments is configured to convey data to the memory, and wherein a different subset of the plurality of segments is configured to convey data from the memory.

22. The integrated circuit as recited in claim 21, wherein the control unit is configured to enable a write to the memory via a first path formed of the first subset of the plurality of segments and a read operation from the memory via a second path formed of the second subset of the plurality of segments, wherein the read operation and the write operation are performed concurrently.

23. The integrated circuit as recited in claim 20, wherein the control unit is configured to determine the path based at least in part on an address associated with the request for access.

24. The integrated circuit as recited in claim 20, wherein each of the one or more functional units is a processor core each having at least one level one (L1) cache, and wherein the memory supercell forms at least a portion of a level two (L2) cache, and wherein each processor core includes a data cache coupled to receive data from the switch, an instruction cache configured to receive instructions from the switch, and a cache writeback unit configured to convey data to the switch.

* * * * *